(12) United States Patent
Pelley et al.

(10) Patent No.: US 9,225,337 B2
(45) Date of Patent: Dec. 29, 2015

(54) TEMPERATURE THRESHOLD CIRCUIT WITH HYSTERESIS

(71) Applicants: Perry H. Pelley, Austin, TX (US); George P. Hoekstra, Austin, TX (US); Ravindraraj Ramaraju, Round Rock, TX (US)

(72) Inventors: Perry H. Pelley, Austin, TX (US); George P. Hoekstra, Austin, TX (US); Ravindraraj Ramaraju, Round Rock, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 191 days.

(21) Appl. No.: 14/191,684

(22) Filed: Feb. 27, 2014

(65) Prior Publication Data

US 2015/0244375 A1 Aug. 27, 2015

(51) Int. Cl.
*G01K 1/02* (2006.01)
*H03K 21/10* (2006.01)
*G01K 7/00* (2006.01)
*H03K 21/38* (2006.01)
*G01K 13/00* (2006.01)

(52) U.S. Cl.
CPC *H03K 21/10* (2013.01); *G01K 7/00* (2013.01); *H03K 21/38* (2013.01); *G01K 1/028* (2013.01); *G01K 13/002* (2013.01)

(58) Field of Classification Search
None
See application file for complete search history.

(56) References Cited

U.S. PATENT DOCUMENTS

| 4,551,031 | A | * | 11/1985 | Ishikawa et al. | 374/117 |
|---|---|---|---|---|---|
| 4,644,481 | A | * | 2/1987 | Wada | 702/131 |
| 5,214,668 | A | * | 5/1993 | Satou et al. | 374/117 |
| 5,388,134 | A | | 2/1995 | Douglass et al. | |
| 5,638,418 | A | * | 6/1997 | Douglass et al. | 377/25 |
| 5,836,691 | A | * | 11/1998 | Yamauchi | 374/117 |
| 5,899,570 | A | * | 5/1999 | Darmawaskita et al. | 374/170 |
| 6,612,502 | B2 | | 9/2003 | Poucher | |
| 6,893,154 | B2 | | 5/2005 | Gold et al. | |
| 8,779,787 | B2 | * | 7/2014 | Laplanche | 324/750.01 |
| 2007/0018864 | A1 | | 1/2007 | Khan et al. | |
| 2009/0015232 | A1 | | 1/2009 | Rozen et al. | |
| 2014/0211905 | A1 | * | 7/2014 | Chuang et al. | 377/25 |

OTHER PUBLICATIONS

Bobrov, Boris B. et al., "i.MX31 and i.MX31L Power Management", http://cache.freescale.com/files/32bit/doc/white_paper/IMX31POWERWP.pdf, Freescale Semiconductor White Paper, Rev. 1, Dec. 2006, pp. 1-11.
"i.MX53 Multimedia Applications Processor Reference Manual", http://cache.freescale.com/files/32bit/doc/ref_manual/iMX53RM.pdf, Freescale Semiconductor, Inc., Document No. iMX53RM, Rev. 2.1, Jun. 2012, Chapter 64.6.2.4.10, pp. 3966-3968 (Figure 64-17).

* cited by examiner

*Primary Examiner* — Tuan T Lam

(57) ABSTRACT

A circuit for determining a threshold indication of temperature with respect to a threshold temperature. The circuit includes a timer circuit and a temperature sensor circuit having an counter whose output has a relationship to temperature. At the end of a period determined by the timer circuit, a comparator circuit compares the count of the counter with an indication of the threshold temperature to determine a state of the threshold indication. In response to a change in state of the threshold indication, the circuit changes one of the count time or the counter output's relationship to temperature to provide a hysteresis for the threshold indication.

20 Claims, 4 Drawing Sheets

THRESHOLD = 60 ⇔ 90°

| TIME | CURRENT CONDITION | TIMER COUNT | ACT TEMP | SENSE COUNTS AT COMPARE | NEW CONDITION |
|---|---|---|---|---|---|
| $T_0$ | COLD | 128 | 53.5° | 75 | COLD (>60) |
| $T_1$ | COLD | 128 | 90° | 60 | HOT (≤60) |
| $T_2$ | HOT | 124 | 88° | 59 | HOT (≤60) |
| $T_3$ | HOT | 124 | 84° | 62 | COLD (>60) |
| $T_4$ | COLD | 128 | 88° | 62 | COLD (>60) |

FIG. 3

THRESHOLD = 60 ⇔ 90° ⇔ THRESHOLD COMPARE COUNT 64

| TIME | CURRENT CONDITION | TIMER COUNT | ACT TEMP | SENSOR START VALUE | SENSE COUNTS AT COMPARE | NEW CONDITION |
|---|---|---|---|---|---|---|
| $T_0$ | COLD | 128 | 53.5° | 4 | 79 | COLD (>64) |
| $T_1$ | COLD | 128 | 90° | 4 | 64 | HOT (≤64) |
| $T_2$ | HOT | 128 | 88° | 0 | 63 | HOT (≤64) |
| $T_3$ | HOT | 128 | 84° | 0 | 69 | COLD (>64) |
| $T_4$ | COLD | 128 | 88° | 4 | 67 | COLD (>64) |

FIG. 4

TEMPERATURE THRESHOLD CIRCUIT WITH HYSTERESIS

BACKGROUND

1. Field

This disclosure relates generally to integrated circuits, and more specifically, to a temperature threshold circuit with hysteresis.

2. Related Art

In many integrated circuits, it is desirable to detect when temperature of the integrated circuit has reached a specific temperature level or range of temperatures. For example, in a temperature critical application, such as when the integrated circuit system that is sensitive to thermal runaway, it may be necessary to take action upon the temperature reaching a certain level, before thermal runaway occurs. In another example, the detection of temperatures or temperature levels may be useful in voltage-frequency power management or fan control. Therefore, a need exists for a temperature monitor capable of indicating when the temperature of an integrated circuit has reached a particular temperature condition.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 3 illustrates, in table form, one example of various values of the circuit of FIG. 1 during operation of FIG. 1.

FIG. 4 illustrates, in table form, one example of various values of the circuit of FIG. 2 during operation of FIG. 2.

DETAILED DESCRIPTION

A temperature threshold circuit with hysteresis includes a first oscillator which is coupled to a first counter which operates as a timer circuit to provide a compare time to a clock input of a digital comparator. A second oscillator is coupled to a second counter which operates as a temperature sensor to provide a temperature indication to a first input of the digital comparator. A threshold count value indicative of a threshold temperature is provided to a second input of the digital comparator. At each compare time provided by the first counter, the digital comparator compares the output of the second counter to the threshold count value and provides a HOT indicator in response thereto which, when asserted, indicates that the temperature of the integrated circuit which includes the temperature threshold circuit is greater than the threshold temperature (thus indicating a HOT condition), and, when negated, indicates that the temperature is less than the threshold temperature (thus indicating a COLD condition). In response to assertion of the HOT indicator (indicating a transition from the COLD condition to the HOT condition), a parameter of the temperature threshold circuit is adjusted in order to provide for hysteresis for the HOT indicator. In one embodiment, a duration of the compare time is decreased upon a transition from COLD to HOT such that it takes a lower temperature to transition back to a COLD condition. In another embodiment, a count value to temperature relationship of the second counter of the temperature sensor is changed upon a transition from COLD to HOT such that it takes a lower temperature to transition back to a COLD condition. In yet other embodiments, operation of one of the oscillators may be changed to affect the transition from HOT back to COLD. In this manner, by making any of these adjustments, the hysteresis prevents the HOT indicator from being asserted and negated too frequently, such as when the temperature is close to the temperature threshold. That is, the hysteresis makes the HOT indicator less sensitive to change by, for example, requiring a lower temperature to transition back to a COLD condition.

Figure 1:
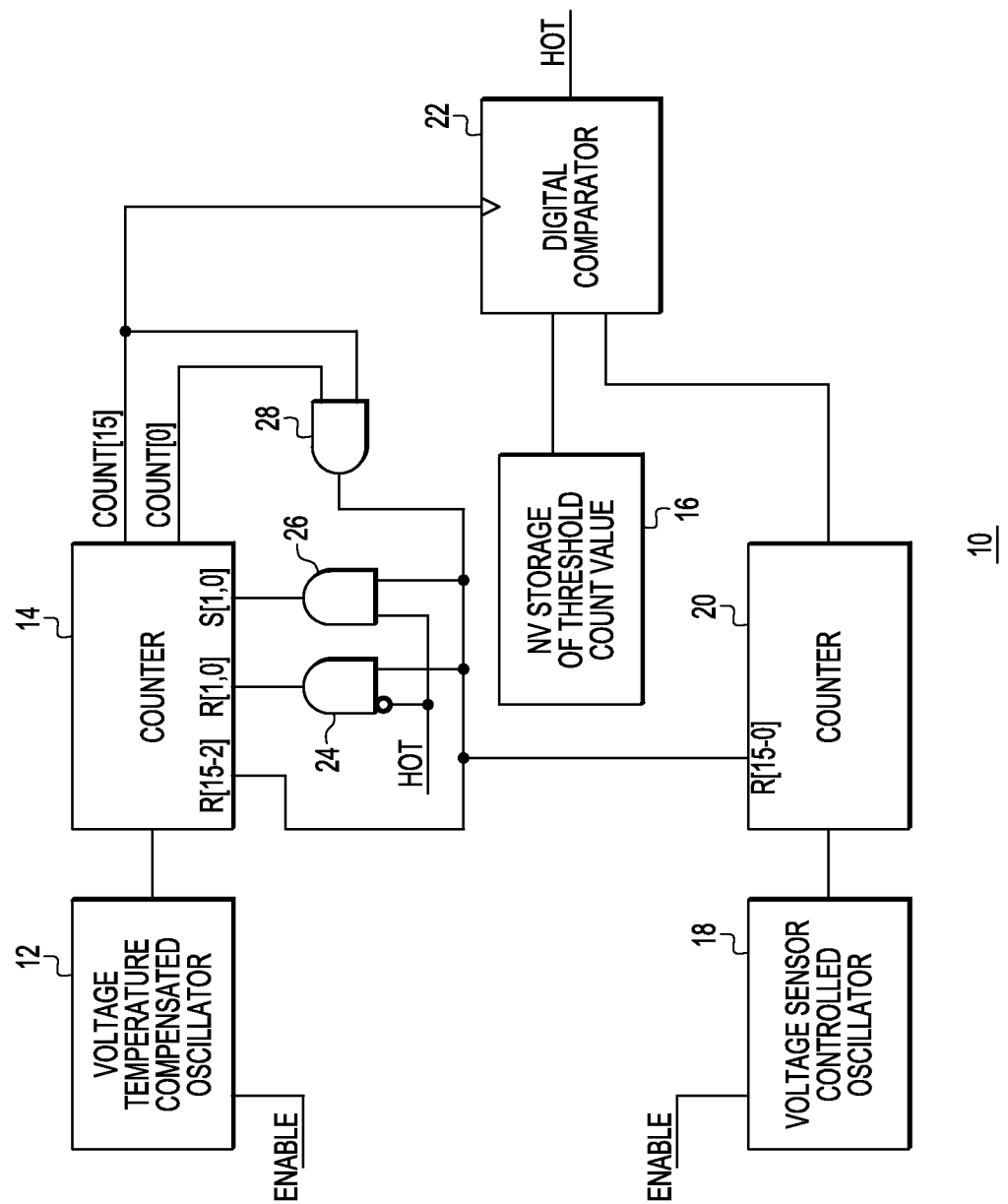
FIG. 1 illustrates, in partial block diagram and partial schematic form, a temperature threshold circuit with hysteresis, in accordance with an embodiment of the present invention.

FIG. 1 illustrates a temperature threshold system 10 in accordance with one embodiment of the present invention. System 10 may be located on an integrated circuit which may include other types of circuitry to perform any other functions. System 10 includes a voltage controlled oscillator 12, a counter 14, a digital comparator 22, storage circuitry 16 configured to store a threshold counter value, AND gates 24, 26, and 28, a voltage controlled oscillator 18, and a counter 20. Each of oscillators 12 and 18 is coupled to receive an enable signal. Oscillator 12 has an output coupled to an input of counter 14, in which counter 14 counts cycles output from oscillator 12. Therefore, oscillator 12 controls the count rate of counter 14. In the illustrated embodiment, counter 14 is a 16-bit counter, in which the $16^{th}$ bit (referred to as count[15] is the most significant bit (MSB)) of the output of counter 14. Count[15] is provide to a clock input of digital comparator 22. AND gate 28 receives count[0] (which is the least significant bit (LSB) of the output of counter 14) at a first input, and count[15] at a second input. An output of AND gate 28 is provided to the 16 bit reset input (R[15-0]) of counter 20, to a first input of AND gate 26, a first input of AND gate 24, and to the 14 MSBs of the reset input of counter 14 (referred to as R[15-2]). An output of digital comparator 22, a HOT indicator, is provided to a second input of AND gate 24, which is an inverting input such that the inverse of the HOT indicator is ANDed with the output of AND gate 28. The HOT indicator is also provided to a second input of AND gate 26. An output of AND gate 24 is provided to the two least significant bits of the reset input of counter 14 (referred to as R[1,0]), and an output of AND gate 26 is provided to the two least significant bits of the set input of counter 14 (referred to as S[1,0]). Note that when a reset input for a particular bit is asserted, that bit of the count value of counter 14 is reset to a logic level zero, and when a set input for a particular bit is asserted, that bit of the count value of counter 14 is set to a logic level one.

Still referring to FIG. 1, digital comparator 22 has a first data input coupled to storage circuitry 16. In one embodiment, storage circuitry 16 may be nonvolatile storage. Oscillator 18 has an output coupled to an input of counter 20, in which counter 20 counts cycles output from oscillator 18. Therefore, oscillator 18 controls the count rate of counter 20. The output of counter 20 provides a count indicative of a temperature to a second data input of digital comparator 22. An output of AND gate 28 is provided to each bit of the reset input of counter 20 (referred to as R[15-0]). Note that when a reset input for a particular bit is asserted, that bit of the count value of counter 20 is reset to a logic level zero.

In operation, digital comparator 22 compares the count from counter 20 to the threshold count value stored in storage circuitry 16 each time the signal at the clock input of digital comparator 22 (e.g. count[15]) is asserted. The HOT indicator is asserted when the count of counter 20 is less than (or equal to) the threshold count value stored in storage circuitry 16.

Upon system 10 being enabled, oscillators 12 and 18 are enabled to provide an oscillator output to counters 14 and 20, respectively. Counter 14 increments with each cycle from oscillator 12, and counter 20 increments with each cycle from oscillator 18. The most significant bit (MSB) of counter 14, count[15], is provided to the clock input of digital comparator 22, such that each time count[15] as asserted, digital comparator 22 is enabled to compare its inputs and provide the HOT indicator accordingly. In the illustrated embodiment, when digital comparator 22 is enabled to perform the comparison, if the value of counter 20 is greater than the threshold count value of storage circuitry 16, then a COLD condition is indicated and the HOT indicator is negated. If the value of counter 20 is less than (or equal to) the threshold count value of storage circuitry 16, then a HOT condition is indicated and the HOT indicator is asserted.

In one embodiment, the threshold count value may be determined during the manufacture of system 10 or may be determined during an initialization process while operating system 10. Note that the speed of oscillator 18 varies with temperature such that at hotter temperatures, oscillator 18 oscillates slower as compared to colder temperatures. Therefore, counter 20 will count faster at colder temperatures and slower at hotter temperatures. The threshold count value stored in storage circuitry 16 can be selected to indicate a specific temperature. This specific temperature is selected to correspond to the boundary between what is to be considered a HOT condition and a COLD condition for system 10. Therefore, depending on the needs of system 10, the boundary temperature can be selected accordingly. To determine the threshold count value, oscillator 18 and counter 20 are operated at the specific temperature for a predetermined amount of time to determine the count value of counter 20 which corresponds to that temperature. Alternatively, this count value can be determined through calculations rather than operating oscillator 18 and counter 20. This count value, which corresponds to the specific temperature that is to determine the boundary between a HOT condition and a COLD condition, may be stored in storage circuitry 16 and used during operation of system 10.

Therefore, in one embodiment, the time period for counter 14 to assert count[15] can be set to the predetermined amount of time which was used to determine the threshold count value. For example, if counter 14 is a 16 bit counter, then, assuming counter 14 starts counting at 0, the time period at which a compare is to be performed by digital comparator 22 corresponds to the time it takes for counter 14 to count from 0 to 0b1000 0000 0000 0000. This time period is determined by the speed of oscillator 12. In one embodiment, oscillator 12 is a voltage and temperature compensated oscillator which may use, for example, a bandgap voltage and current generator such that the oscillator rate does not vary with temperature (i.e. such that oscillator 12 is temperature independent). In an alternate embodiment, other types of oscillators may be used for oscillator 12, even those which are not temperature independent, so long as oscillator 12 has a different temperature coefficient than oscillator 18.

Assuming system 10 is initially in a COLD condition, HOT is a logic level zero. That is, it is assumed that system 10 is operating at a temperature that is less than the boundary temperature between COLD and HOT. Since HOT is a logic level zero, the output of AND gate 24 depends on the output of AND gate 28, and the output of AND gate 26 is a logic level 0. Therefore, during a COLD condition, the reset inputs (R[15-0]) of counters 14 and 20 depend on the output of AND gate 28. During a COLD condition, when count[0] and count[15] are both logic level ones, counters 14 and 20 are both reset to 0. Counter 14 counts cycles from oscillator 12 while counter 20 counts cycles from oscillator 18. When count[15] of counter 14 is asserted (indicating that counter has counted up to 0b1000 0000 0000 0000), digital comparator 22 compares the output of counter 20 with the threshold count value. If the output of counter 20 is greater than the threshold count value, then a COLD condition remains and HOT remains a logic level 0. Upon counter 14 reaching the next count value (0b1000 0000 0000 0001), the output of AND gate 28 will be a logic level 1, thus resetting both counters 14 and 20 to 0. Therefore, during a COLD condition, the time period at which comparisons are performed by digital comparisons 22 is determined by the time it takes from counter 14 to count from 0 to 0b1000 0000 0000 0000. Note that by resetting counters 14 and 20 when both count[15] and count[0] have been asserted, a delay is provided after the comparison by digital comparator 22 which occurs when count[15] first reaches a logic level one. In alternate embodiments, other values of counter 14 or other methods may be used to provide a signal, such as the output of AND gate 28, which indicates that a reset of the counters should occur.

If, at a comparison by digital comparator 22, the output of counter 20 is less than or equal to the threshold count value, the HOT indicator is asserted, thus becoming a logic level one and system 10 transitions from a COLD condition to a HOT condition. In this case, the output of AND gate 24 is a logic level zero such that the inputs to R[1,0] remain a logic level zero. When count[15] and count[0] are both logic level ones, a reset of counter 14 and counter 20 is again performed. However, while R[15-2] of counter 14 and R[15-0] of counter 20 are asserted to result in bits 15-2 of counter 14 to reset to 0 and bits 15-0 of counter 20 to reset to 0, S[1,0] is asserted thus causing bits 1 and 0 of counter 14 to be a logic level 1. In this case, while counter 20 is reset to 0, counter 14 is reset to 0b0000 0000 0000 0011. In this manner, note that count[15] will be asserted sooner as compared to resetting counter 14 to 0b0000 0000 0000 0000. Therefore, the time period at which digital comparator 22 performs its comparison to determine whether a transition from the HOT condition back to the COLD condition has occurred is shorter as compared to the time period for comparisons when detecting a transition from COLD to HOT. That is, during a HOT condition, comparisons are performed more often by digital comparator 22 as compared to during a COLD condition. This is accomplished by resetting counter 14 to 0 during a COLD condition but to a larger value during a HOT condition. This larger value can be set according to the design of system 10.

During the HOT condition, with the shorter time period available between comparisons by digital comparator 22, it is more difficult for counter 20 to reach the threshold count value. That is, oscillator 18 must operate faster for system 10 to transition back to a COLD condition. Since the speed of oscillator 18 increases as temperature decreases, the temperature of system 10 has to drop sufficiently to allow counter 20 to reach the threshold count value in the reduced time period provided by counter 14 to digital comparator 22. This provides hysteresis for system 10 to prevent overly frequent transitions between the HOT and COLD conditions.

FIG. 3 illustrates, in table form, an example of values for system 10. Note that the values in FIG. 3 are provided only as an example. For FIG. 3, it is assumed that the boundary temperature between HOT and COLD is 90 degrees Celsius. During an initialization process, it was determined that at 90 degrees, the counter value of counter 20 as controlled by oscillator 18 is 60. That is, when counter 20 is greater than 60, then a COLD condition is indicated and when counter 20 is less than or equal to 60, a HOT condition is indicated. Initially, it is assumed that system 10 is in a COLD condition and the timer count (which corresponds to the time period provided by counter 14) is 128. For ease of explanation, it is assumed, for the example of FIG. 3, that timer 14 is an 8-bit counter rather than a 16 bit counter. Therefore, referring back to FIG. 1, count[15] would instead be count[7], which corresponds to the MSB of counter 14 and to a decimal value of 128. Therefore, at each timer count of 128 counts, at which point count[7] is asserted, digital comparator 22 is enabled to compare the output of counter 20 (which may be referred to as the sense count) to the threshold count value of 60. It is assumed that the actual temperature at time t0 of FIG. 3 is 53.5 degrees Celsius. In this example, at time T0 at which point a comparison is made, since the output of counter 20 is 75, which is greater than 60, a COLD condition remains. During the COLD condition, each time counter 14 is reset, it is reset to 0. This allows for counter 14 to count to 128 before another comparison is performed by digital comparator 22.

By time T1, the actual temperature of system 10 has increased to 90 degrees Celsius. The timer count is still 128 because during the previous COLD condition, counter 14 was reset to 0. However, when 128 is reached by counter 14, digital comparator 22 determines that the sensed count from counter 20 is 60 which is now less than or equal to 60. Thus system 10 transitions to a HOT condition, in which HOT is asserted. Since there is now a HOT condition, upon reset of counter 14 triggered by the output of AND gate 28 being a logic level one, counter 14 is reset to a larger value than 0. In the current example, the value is 0b0000 0011, which corresponds to a decimal value of 124. Note that 124 is 4 counts less than 128 due to setting the 2 LSBs of counter 14 to logic level one upon a reset as triggered by the assertion of the output of AND gate 28.

By time T2, the actual temperature of system 10 has decreased to 88 degrees. However, the timer count is now set at 124 due to resetting the count value to 0b0000 0011 rather than 0. In this shorter timer count period provided by counter 14, the sensed count from counter 20 only reaches 59. Digital comparator 22, upon counter 14 reaching 124, determines that 59 is less than or equal to 60, therefore, system 10 remains in a HOT condition. Therefore, note that although the actual temperature fell to 88 degrees, which is below the boundary temperature of 90 degrees, the condition of system 10 did not change back to a COLD condition because the sensed count of counter 20 did not reach a high enough count to reach the threshold count value due to the reduced timer count of counter 14. That is, at 88 degrees, oscillator 18 did not operate fast enough to allow counter 20 to reach the threshold count value in the reduced timer count of 124.

By time T3, the actual temperature of system 10 has decreased to 84 degrees. At this colder temperature, oscillator 18 operates faster and thus counter 20 counts faster. Upon counter 14 reaching the timer count of 124, digital comparator 22 determines that the sensed count, which is 62, is greater than the threshold count value. Therefore, system 10 transitions from a HOT condition to a COLD condition. Since system 10 is now in a COLD condition, note that the timer count will be reset back to 128 by resetting counter 14 to 0 rather than 0b0000 0011.

By time T4, the actual temperature of system 10 has increased again to 88 degrees. With the timer count now at 128, the sensed count of 120 reaches 62 within the time allowed by the timer count. Therefore, when timer 14 reaches 128, digital comparator 22 determines that the sensed count is greater than 60 and system 10 remains in a COLD condition.

Note that the actual temperature of 88 degrees was not sufficient to transition system 10 from the HOT to COLD condition at time T2 because the sensed count of counter 20 did not have sufficient time with the reduced timer count of 124 to reach beyond 60. However, the actual temperature of 88 degrees at time T4 did result in system 10 being in a COLD condition due to the greater timer count of 128.

Note that in the illustrated embodiments, counters 14 and 20 counted up. However, in alternate embodiment, system 10 may be designed such that either one or both count down. In this embodiment, such as for counter 14, upon reset, counter 14 would be reset to a different maximum value depending on whether the current condition is COLD or HOT. Also, counter 20 can be set to the threshold count value to determine if the counter 20 has expired within the timer count period. Furthermore, counter 14 can be implemented with different timer circuitry as needed to provide the timer count to digital comparator 22.

Figure 2:
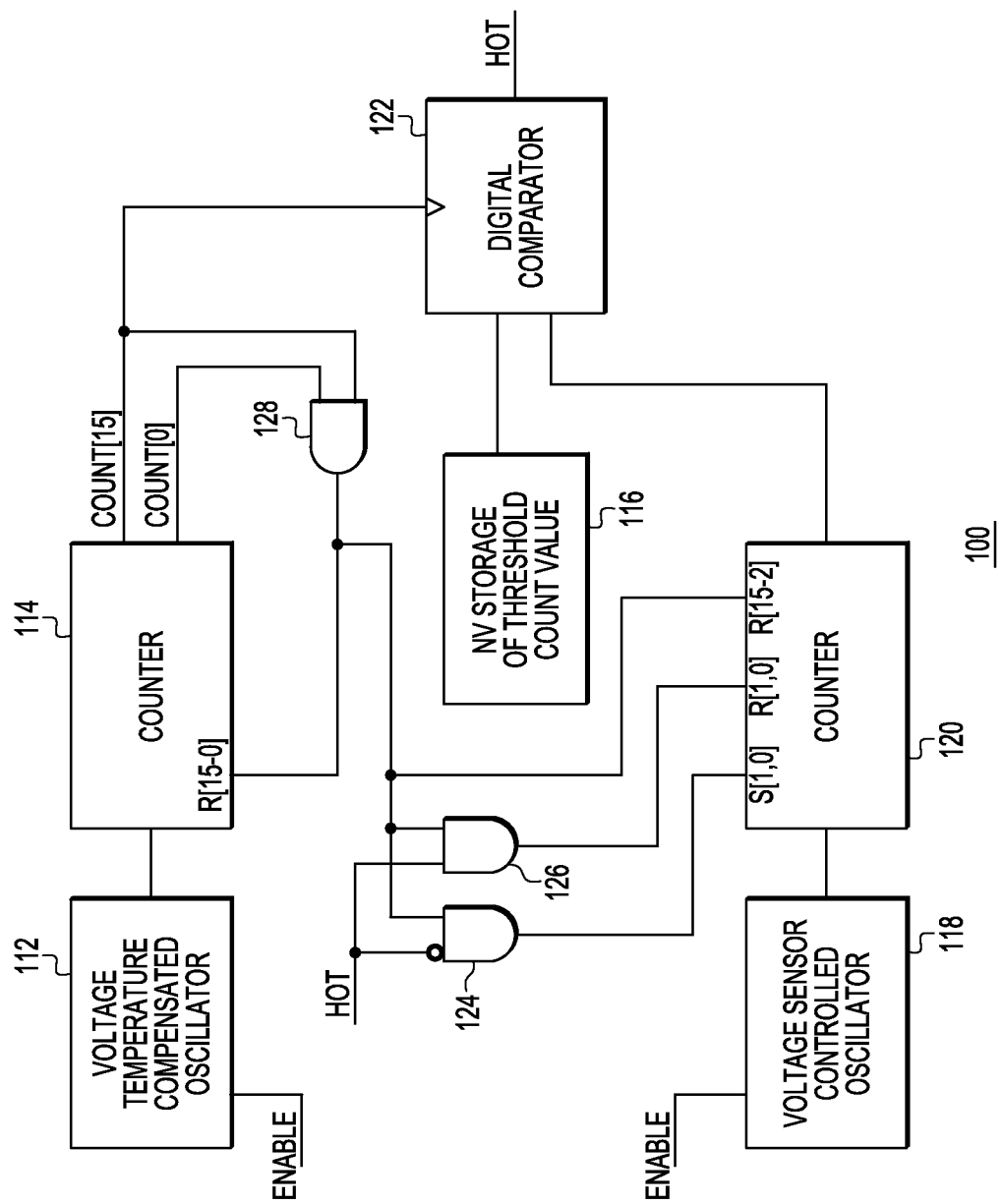
FIG. 2 illustrates, in partial block diagram and partial schematic form, a temperature threshold circuit with hysteresis, in accordance with an embodiment of the present invention.

FIG. 2 illustrates a temperature threshold system 100 in accordance with another embodiment of the present invention. System 100 may be located on an integrated circuit which may include other types of circuitry to perform any other functions. System 100 includes a voltage controlled oscillator 112, a counter 114, a digital comparator 122, storage circuitry 116 configured to store a threshold count value, AND gates 128, 124, and 126, a voltage controlled oscillator 118, and a counter 120. Each of oscillators 112 and 118 is coupled to receive an enable signal. Oscillator 112 has an output coupled to an input of counter 114, in which counter 114 counts cycles output from oscillator 112. Therefore, oscillator 112 controls the count rate of counter 114. In the illustrated embodiment, counter 114 is a 16-bit counter, in which the $16^{th}$ bit (referred to as count[15] is the most significant bit (MSB)) of the output of counter 114. Count[15] is provided to a clock input of digital comparator 122. AND gate 128 receives count[0] (which is the least significant bit (LSB) of the output of counter 114) at a first input, and count[15] at a second input. An output of AND gate 128 is provided to the 16 bit reset input (R[15-0]) of counter 114, to a first input of AND gate 126, a first input of AND gate 124, and to the 14 MSBs of counter 120 (referred to as R[15-2]). An output of digital comparator 122, a HOT indicator, is provided to a second input of AND gate 124, which is an inverting input such that the inverse of the HOT indicator is ANDed with the output of AND gate 128. The HOT indicator is also provided to a second input of AND gate 126. An output of AND gate 126 is provided to the two least significant bits of the reset input of counter 120 (referred to as R[1,0]), and an output of AND gate 124 is provided to the two least significant bits of the set input of counter 120 (referred to as S[1,0]). Note that when a reset input for a particular bit is asserted, that bit of the count value of corresponding counter 114 or 120 is reset to a logic level zero, and when a set input for a particular bit is asserted, that bit of the count value of corresponding counter 114 or 120 is set to a logic level one.

Still referring to FIG. 2, digital comparator 122 has a first data input coupled to storage circuitry 116. In one embodiment, storage circuitry 116 may be nonvolatile storage. Oscillator 118 has an output coupled to an input of counter 120, in which counter 120 counts cycles output from oscillator 118. Therefore, oscillator 118 controls the count rate of counter 120. The output of counter 120 provides a count indicative of a temperature to a second data input of digital comparator 122. An output of AND gate 128 is provided bits 15-2 of the reset input of counter 120 (referred to as R[15-2]). Note that when a reset input for a particular bit is asserted, that bit of the count value of counter 120 is reset to a logic level zero.

In operation, digital comparator 122 compares the count from counter 120 to the threshold count value stored in storage circuitry 116 each time the signal at the clock input of digital comparator 122 (e.g. count[15]) is asserted. The HOT indicator is asserted when the count of counter 120 is less than the threshold count value stored in storage circuitry 116.

Upon system 100 being enabled, oscillators 112 and 118 are enabled to provide an oscillator output to counter 114 and 120, respectively. Counter 114 increments with each cycle from oscillator 112, and counter 120 increments with each cycle from oscillator 114. The MSB of counter 114, count [15], is provided to the clock input of digital comparator 122, such that each time count[15] as asserted, digital comparator 122 is enabled to compare its inputs and provide the HOT indicator accordingly. In the illustrated embodiment, when digital comparator 122 is enabled to perform the comparison, if the value of counter 120 is greater than the threshold count value of storage circuitry 116, then a COLD condition is indicated and the HOT indicator is negated. If the value of counter 120 is less than the threshold count value of storage circuitry 116, then a HOT condition is indicated and the HOT indicator is asserted.

In one embodiment, the threshold count value may be determined during the manufacture of system 100 or may be determined during an initialization process while operating system 100. Note that the speed of oscillator 118 varies with temperature such that at hotter temperatures, oscillator 118 is slower as compared to colder temperatures. Therefore, counter 120 will count faster at colder temperatures and slower at hotter temperatures. The threshold count value stored in storage circuitry 116 can be selected to indicate a specific temperature. This specific temperature is selected to correspond to the boundary between what is to be considered a HOT condition and a COLD condition for system 100. Therefore, depending on the needs of system 100, the boundary temperature can be selected accordingly. To determine the threshold count value, oscillator 118 and counter 120 are operated at the specific temperature for a predetermined amount of time to determine the count value of counter 120 which corresponds to that temperature. Alternatively, this count value can be determining through calculations rather than operating oscillator 118 and counter 120. This count value, which corresponds to the specific temperature that is to determine the boundary between a HOT condition and a COLD condition may be stored in storage circuitry 116 and used during operation of system 100.

Therefore, in one embodiment, the time period for counter 114 to assert count[15] can be set to the predetermined amount of time which was used to determine the threshold count value. For example, if count is a 16 bit counter, then, assuming counter 114 starts counting at 0, the time period at which a compare is to be performed by digital comparator 122 corresponds to the time it takes for counter 114 to count from 0 to 0b1000 0000 0000 0000. This time period is determined by the speed of oscillator 112. In one embodiment, oscillator 112 is a voltage and temperature compensated oscillator which may use, for example, a bandgap voltage and current generator such that the oscillator rate does not vary with temperature (i.e. such that oscillator 112 is temperature independent). In an alternate embodiment, other types of oscillators may be used for oscillator 112, even those types which are not temperature independent, so long as oscillator 112 has a different temperature coefficient than oscillator 118.

Assuming system 100 is initially in a COLD condition, HOT is a logic level zero. That is, it is assumed that system 100 is operating at a temperature is less than the boundary temperature between COLD and HOT. Since HOT is a logic level zero, the output of AND gate 124 depends on the output of AND gate 128, and the output of AND gate 126 is a logic level 0. Therefore, during a COLD condition, the reset input R[15-0] of counter 114, the reset input R[15-2] of counter 120, and the set inputs S[1,0] of counter 120 depend on the output of AND gate 128. During a COLD condition, when count[0] and count[15] are both at logic level ones, counter 114 is reset to 0 (which corresponds to the starter counter value of counter 114), set inputs S[1,0] of counter 120 are set to logic level ones, and reset inputs R[15-2] are reset to 0. In this manner, during a COLD condition, when count[0] and counter [15] are both logic level ones, counter 120 is set to a starting counter value of 0b0000 0000 0000 0011. That is, note that counter 120, during a COLD condition, is set to an initial counter value that is greater than 0.

When count[15] of counter 114 is asserted (indicating that counter 114 has counted up to 0b1000 0000 0000 0000), digital comparator 122 compares the output of counter 120 with the threshold count value. If the output of counter 120 is greater than the threshold count value, then a COLD condition remains and HOT remains a logic level 0. Upon counter 114 reaching the next count value (0b1000 0000 0000 0001), the output of AND gate 128 will be a logic level 1, thus resetting counter 114 to 0 and counter 120 to its starting counter value 0b0000 0000 0000 0011. Therefore, during a COLD condition, the time period at which comparisons are performed by digital comparisons 122 is determined by the time it takes from counter 114 to count from 0 to 0b1000 0000 0000 0000. Note that by resetting counters 114 and 120 to their starter counter values when count[15] and count[0] have been asserted, a delay is provided after the comparison by digital comparator 122 which occurs when count[15] first reaches a logic level one. In alternate embodiments, other values of counter 114 or other methods may be used to provide a signal, such as the output of AND gate 128, which indicates that counters 114 and 120 should be rest to their starting counter values.

If, at a comparison by digital comparator 122, the output of counter 120 is less than or equal to the threshold count value, the HOT indicator is asserted, thus becoming a logic level one and system 100 transitions from a COLD condition to a HOT condition. In this case, the output of AND gate 124 is a logic level zero such that the inputs to S[1,0] remain a logic level zero. When count[15] and count[0] are both logic level ones, a reset of counter 114 and counter 120 is again performed to their starter counter values. In this case, counter 114 is reset to 0, as was done during the COLD condition. However, reset bits R[1,0] as well as reset bits R[15-2] of counter 120 are also reset to 0. Therefore, during the HOT condition, upon count [15] and count[0] both being logic levels ones, counter 112 is set to a start counter value of 0 rather than the 0b0000 0000 0000 0011 which occurs during the COLD condition. In this manner, during a HOT condition, counter 120 needs to count slower during the time period provided by counter 114 in order to reach the threshold voltage which allows it to transition from the HOT condition back to the COLD condition. This is accomplished by, after each comparison by digital counter 122, setting the starter count value of counter 120 to a different value depending upon whether it is currently a HOT or a COLD condition. For example, during a HOT condition, the starter counter value of counter 120 is greater than the starter count value used during a COLD condition. This larger value can be set according to the design of system 100.

During the HOT condition, with the lower counter start value, counter 120 must count faster to reach the threshold count value. Thus it becomes more difficult for system 100 to transition back to a COLD condition. Since the speed of oscillator 118 increases as temperature decreases, the temperature of system 100 has to drop sufficiently to allow counter 120 to reach the threshold count value from the lower starter count value with the time period provided by counter 14 to digital comparator 22. This provides hysteresis for system 100 to prevent overly frequent transitions between the HOT and COLD conditions.

FIG. 4 illustrates, in table form, an example of values for system 100 of FIG. 2. Note that the values in FIG. 4 are provided only as an example. For FIG. 4, it is assumed that the boundary temperature between HOT and COLD is 90 degrees Celsius. During an initialization process, it was determined that at 90 degrees, the counter value of counter 120 as controlled by oscillator 118 is 60. However, in this embodiment, since the start value during the COLD condition is now 0b0000 0000 0000 0011 (which is a decimal value of 4), the threshold count value of 64 (60+4) is stored in threshold count value storage 116. That is, when counter 120 is greater than 64, then a COLD condition is indicated and when counter 120 is less than or equal to 64, a HOT condition is indicated.

Initially, it is assumed that system 100 is in a COLD condition and the timer count (which corresponds to the time period provided by counter 14) is 128. For ease of explanation, it is assumed, for the example of FIG. 4, that timer 114 is an 8-bit counter rather than a 16 bit counter. Therefore, referring back to FIG. 2, count[15] would instead be count[7], which corresponds to the MSB of counter 114 and to a decimal value of 128. Therefore, at each timer count of 128 counts, at which point count[7] is asserted, digital comparator 122 is enabled to compare the output of counter 120 (which is referred to as the sense count) to the threshold count value of 64. It is assumed that the actual temperature at time T0 of FIG. 4 is 53.5 degrees Celsius. In this example, at time T0 at which point a comparison is made, since the output of counter 120 is 79, which is greater than 64, a COLD condition remains. During the COLD condition, each time count[7]=count[0] (after a comparison has been performed by comparator 12), counter 114 is reset to 0 and counter 120 is reset to its starter count value of 4 (e.g. 0b0000 0000 0000 0011 in the case of a 16-bit timer). Therefore, for a COLD condition to remain, counter 120 must count 60 counts (from 4 to 64) within the timer period provided by counter 114, before another comparison is performed by digital comparator 122.

By time T1, the actual temperature of system 100 has increased to 90 degrees Celsius. The timer count remains 128 in which counter 114 was reset to 0 after the previous comparison by digital comparator 116. However, when 128 is subsequently reached by counter 114, digital comparator 122 determines that the sensed count from counter 120 is 64 which is now less than or equal to 64. Thus system 100 transitions to a HOT condition, in which HOT is asserted. Since there is now a HOT condition, upon reset of counter 120 triggered by the output of AND gate 128 being a logic level one, counter 120 is reset the starter counter value of 0. Note that the starter count value of counter 120 is now 4 counts less than was previously used during the COLD condition. This is due to setting the 2 LSBs of counter 120 to logic level zero upon a reset as triggered by the assertion of the output of AND gate 128.

By time T2, the actual temperature of system 100 has decreased to 88 degrees. When 128 has again been reached by timer 114, the sensed count output from counter 120 has reached 63. Digital comparator 122 determines that 63 is less than or equal to 64, therefore, system 100 remains in a HOT condition. Therefore, note that although the actual temperature fell to 88 degrees, which is below the boundary temperature of 90 degrees, the condition of system 100 did not change back to a COLD condition because the sensed counter of counter 120 did not reach a high enough count to reach the threshold counter value due to now starting at a starter counter value of 0 rather than 4. That is, at 88 degrees, oscillator 118 did not operate fast enough to allow counter 120 to reach the threshold count value which now requires 64 counts rather than just 60 counts of the output of oscillator 118.

By time T3, the actual temperature of system 100 has decreased to 84 degrees. At this colder temperature, oscillator 118 operates faster and thus counter 120 counts faster. Upon counter 114 reaching the timer count of 128, digital comparator 122 determines that the sensed count, which is 69, is greater than the threshold count value of 64. That is, since oscillator 118 was operating faster, counter 120 was still able to reach the threshold count value of 64 even though its starter counter value was reset to 0 rather than 4 (which occurred the previous time count[7] equaled count[0]). Therefore, system 100 transitions from a HOT condition to a COLD condition. Since system 100 is now in a COLD condition, note that the starter counter value of counter 120 (when count[7] next equals count[0]) will be 4 rather than 0.

By time T4, the actual temperature of system 100 has increased again to 88 degrees. When counter 114 reaches 128, digital comparator 22 determines that the sensed count of counter 120 is 67 which is greater than 64 and system 100 remains in a COLD condition. Note that the actual temperature of 88 degrees was not sufficient to transition system 100 from the HOT to COLD condition at time T2 because the sensed count of counter 120 did not have sufficient time with the reduced starter counter value of 0 to reach beyond 64. However, the actual temperature of 88 degrees at time T4 did result in system 100 being in a COLD condition due to the greater starter counter value of 0.

Note that in the illustrated embodiments, counters 114 and 120 counted up. However, in alternate embodiment, system 100 may be designed such that either one or both count down. In this embodiment, such as for counter 120, upon reset to a new starter counter value, counter 120 would be reset to a different maximum value depending on whether the current condition is COLD or HOT. Furthermore, counter 114 can be implemented with different timer circuitry as needed to provide the timer count to digital comparator 122.

Figure 5:
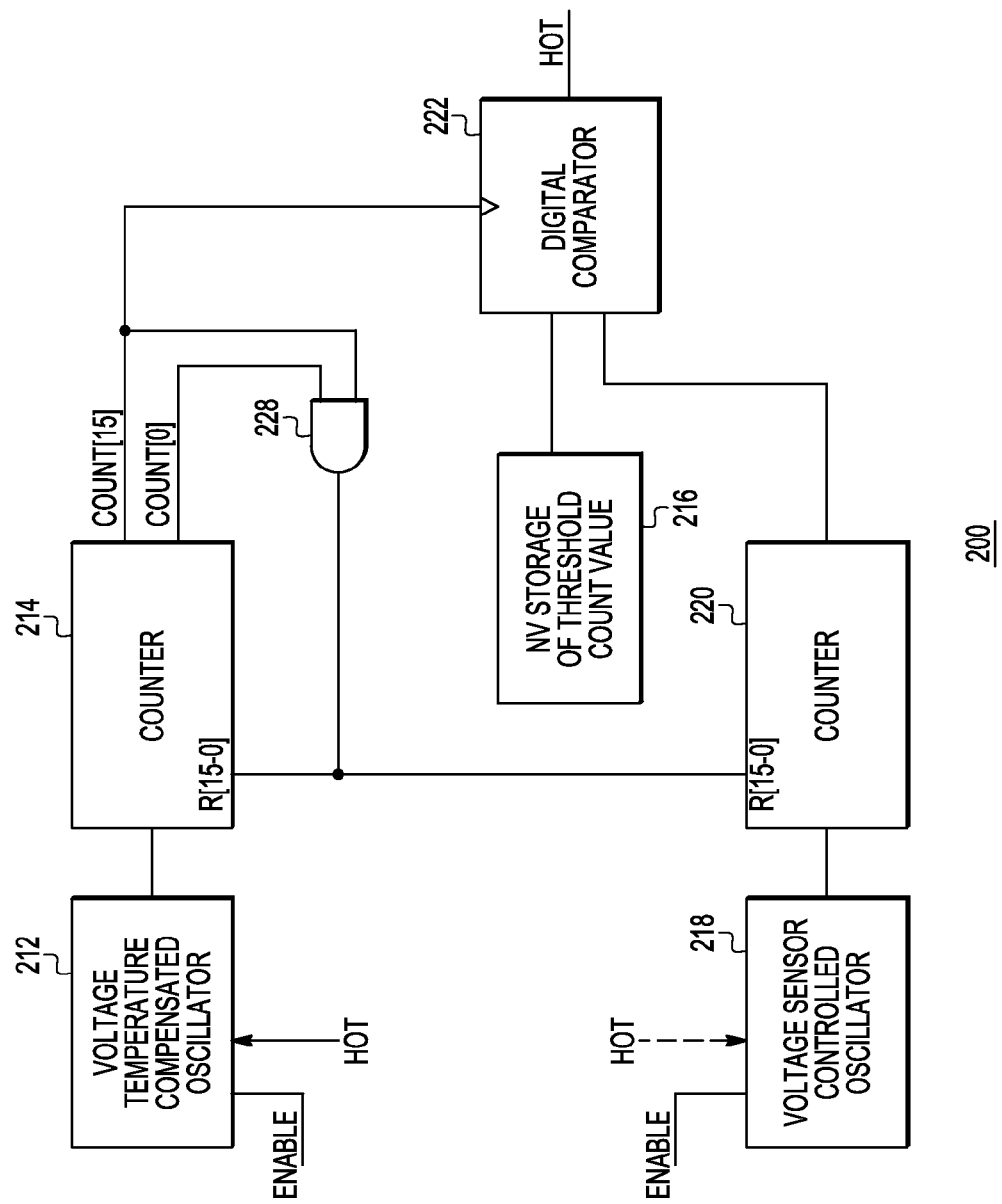
FIG. 5 illustrates, in partial block diagram and partial schematic form, a temperature threshold circuit with hysteresis, in accordance with an embodiment of the present invention.

FIG. 5 illustrates a temperature threshold system 200 in accordance with one embodiment of the present invention. System 200 may be located on an integrated circuit which may include other types of circuitry to perform any other functions. System 200 includes a voltage controlled oscillator 212, a counter 214, a digital comparator 222, storage circuitry 216 configured to store a threshold counter value, AND gate 228, a voltage controlled oscillator 218, and a counter 220. Each of oscillators 212 and 218 is coupled to receive an enable signal. Oscillator 212 has an output coupled to an input of counter 214, in which counter 214 counts cycles output from oscillator 212. Therefore, oscillator 212 controls the count rate of counter 214. In the illustrated embodiment, counter 214 is a 16-bit counter, in which the $16^{th}$ bit (referred to as count[15] is the most significant bit (MSB)) of the output of counter 214. Count[15] is provide to a clock input of digital comparator 222. AND gate 228 receives count[0] (which is the least significant bit (LSB) of the output of counter 214) at a first input, and count[15] at a second input. An output of AND gate 228 is provided to the 16 bit reset input (R[15-0]) of counter 220 and to the 16 bit reset input (R[15-0]) of counter 220. An output of digital comparator 222, a HOT indicator, is provided to oscillator 212. (In an alternate embodiment, to be discussed below, the HOT indicator may be provided to oscillator 218 rather than oscillator 212.) Note that when a reset input for a particular bit is asserted, that bit of the count value of the corresponding counter 214 or 220 is reset to a logic level zero, and when a set input for a particular bit is asserted, that bit of the count value of the corresponding counter 214 or 220 is set to a logic level one.

Still referring to FIG. 5, digital comparator 222 has a first data input coupled to storage circuitry 216. In one embodiment, storage circuitry 216 may be nonvolatile storage. Oscillator 218 has an output coupled to an input of counter 220, in which counter 220 counts cycles output from oscillator 218. Therefore, oscillator 218 controls the count rate of counter 220. The output of counter 220 provides a count indicative of a temperature to a second data input of digital comparator 222. An output of AND gate 228 is provided to each bit of the reset input of counter 214 and of counter 220 (referred to as R[15-0]).

In operation, digital comparator 222 compares the sensed count from counter 220 to the threshold count value stored in storage circuitry 216 each time the signal at the clock input of digital comparator 222 (e.g. count[15]) is asserted. The HOT indicator is asserted when the count of counter 220 is greater than the threshold count value stored in storage circuitry 216.

Upon system 200 being enabled, oscillators 212 and 218 are enabled to provide an oscillator output to counters 14 and 20, respectively. Counter 214 increments with each cycle from oscillator 212, and counter 220 increments with each cycle from oscillator 218. The most significant bit (MSB) of counter 214, count[15], is provided to the clock input of digital comparator 222, such that each time count[15] as asserted, digital comparator 222 is enabled to compare its inputs and provide the HOT indicator accordingly. In the illustrated embodiment, when digital comparator 222 is enabled to perform the comparison, if the value of counter 220 is greater than the threshold count value of storage circuitry 216, then a COLD condition is indicated and the HOT indicator is negated. If the value of counter 220 is less than (or equal to) the threshold count value of storage circuitry 216, then a HOT condition is indicated and the HOT indicator is asserted.

In one embodiment, the threshold count value may be determined during the manufacture of system 200 or may be determined during an initialization process while operating system 200. The threshold count value stored in storage circuitry 216 can be selected to indicate a specific temperature. This specific temperature is selected to correspond to the boundary between what is to be considered a HOT condition and a COLD condition for system 200. Therefore, depending on the needs of system 200, the boundary temperature can be selected accordingly. To determine the threshold count value, oscillator 218 and counter 220 are operated at the specific temperature for a predetermined amount of time to determine the count value of counter 220 which corresponds to that temperature. Alternatively, this count value can be determined through calculations rather than operating oscillator 218 and counter 220. This count value, which corresponds to the specific temperature that is to determine the boundary between a HOT condition and a COLD condition, may be stored in storage circuitry 216 and used during operation of system 10.

Therefore, in one embodiment, the time period for counter 214 to assert count[15] can be set to the predetermined amount of time which was used to determine the threshold count value. For example, if count is a 16 bit counter, then, assuming counter 214 starts counting at 0, the time period at which a compare is to be performed by digital comparator 222 corresponds to the time it takes for counter 14 to count from 0 to 0b1000 0000 0000 0000. This time period is determined by the speed of oscillator 212. In one embodiment, oscillator 212 is a voltage and temperature compensated oscillator which may use, for example, a bandgap voltage and current generator such that the oscillator rate does not vary with temperature (i.e. such that oscillator 212 is temperature independent). In an alternate embodiment, other types of oscillators may be used for oscillator 212, even those types which are not temperature independent, so long as oscillator 212 has a different temperature coefficient than oscillator 218.

In operation, when count[0] and count[15] are both logic level ones, counters 214 and 220 are both reset to 0. Counter 214 counts cycles from oscillator 212 while counter 220 counts cycles from oscillator 218. When count[15] of counter 214 is asserted (indicated that counter has counted up to 0b1000 0000 0000 0000), digital comparator 222 compares the output of counter 220 with the threshold count value. If the output of counter 220 is greater than the threshold count value, then a COLD condition is indicated and if the output of counter 220 is less than or equal to the threshold count value, then a HOT condition is indicated. Note that when counter 214 reaches the next count value (0b1000 0000 0000 0001) after count[15] has been asserted, the output of AND gate 228 will be a logic level 1, thus resetting both counters 214 and 220 to 0. Therefore, the time period at which comparisons are performed by digital comparisons 22 is determined by the time it takes from counter 214 to count from 0 to 0b1000 0000 0000 0000. Note that by resetting counters 214 and 220 when count[15] and count[0] have been asserted, a delay is provided after the comparison by digital comparator 222 which occurs when count[15] first reaches a logic level one. In alternate embodiments, other values of counter 214 or other methods may be used to provide a signal, such as the output of AND gate 228, which indicates that a reset of the counters should occur.

In the illustrated embodiment, the HOT indicator is provided as an input to oscillator 212. In operation, oscillator 212 may operate at different speeds in response to the HOT indicator. For example, in one embodiment, during a HOT condition in which HOT as asserted, oscillator 212 may operate at a higher speed as compared to when HOT is negated. In this manner, during a HOT condition, counter [15] is asserted faster since counter 214 counts faster as compared to the COLD condition. In this case, the time period at which digital comparator 222 performs its comparison is shorter. Therefore, for a transition from HOT back to COLD to occur, oscillator 218 has to be running fast enough to reach the threshold count value in the shorter time period provided by counter 214. However, upon a transition to COLD occurring, in which the HOT indicator is negated, oscillator 212 may operate at a lower speed which results in increasing the time period at which digital comparator 222 performs is comparisons. Therefore, the result is similar to that described above in reference to FIG. 1 in which different time periods are used based on whether the circuit is currently in a HOT or COLD condition. This may provide hysteresis for the HOT indicator.

In an alternate embodiment, the HOT indicator can be provided as an input to oscillator 218 rather than oscillator 212. In this embodiment, oscillator 218 may operate at different speeds in response to the HOT indicator. For example, in one embodiment, during a HOT condition in which HOT is asserted, oscillator 218 may operate at a lower speed as compared to when HOT is negated. In this manner, during a HOT condition, the temperature has to drop sufficiently low to result in oscillator 218 operating fast enough to reach the threshold count value.

Therefore, in this manner, by modifying operation of oscillator 212 or 218 in response to the current condition of the circuit being HOT or COLD, hysteresis can be provided for the determination of the HOT or COLD condition.

By now it should be understood that there has been provided various circuits which allow for hysteresis. For example, a parameter of the temperature threshold circuit may be adjusted in order to provide for hysteresis for the HOT indicator. In one embodiment, a duration of the compare time is decreased upon a transition from COLD to HOT such that it takes a lower temperature to transition back to a COLD condition. In another embodiment, a count value to temperature relationship of the second counter of the temperature sensor is changed upon a transition from COLD to HOT such that it takes a lower temperature to transition back to a COLD condition. In other embodiments, operation of one of the oscillators may be changed to affect the transition from HOT back to COLD. In this manner, by making any of these adjustments, the hysteresis prevents the HOT indicator from being asserted and negated too frequently, such as when the temperature is close to the temperature threshold. That is, the hysteresis makes the HOT indicator less sensitive to change by, for example, requiring a lower temperature to transition back to a COLD condition.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7-0]" or "conductors [7-0] of bus 60" indicates the eight lower order conductors of bus 60, and "count[7-0]" indicates the eight lower order bits of a count value. The symbol "$" preceding a number indicates that the number is represented in its hexadecimal or base sixteen form. The symbol "%" or "0b" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In one embodiment, the illustrated elements of system 10, 100, and 200 are circuitry located on a single integrated circuit or within a same device. Alternatively, the system may include any number of separate integrated circuits or separate devices interconnected with each other. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different types of counters may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In accordance with one embodiment of the present invention, a temperature threshold circuit includes a temperature sensor including a first oscillator and first counter, a count rate of the first counter is controlled by the first oscillator, the temperature sensor including an output for providing a count indicative of a temperature; a timer circuit including an output; a storage device for storing an indication of a threshold temperature; and a threshold indication circuit including a comparator for comparing the output of the first counter with the indication of the threshold temperature at a time indicated by the output of the timer circuit to provide a threshold indication of temperature with respect to the threshold temperature based on the comparing, wherein one of a count time of the timer circuit or a count to temperature relationship of the output of the temperature sensor is changed based on a change of state of the threshold indication. In one aspect of this embodiment, the count time of the timer circuit is changed based on a change of state of the threshold indication. In a further aspect, the timer circuit includes a second counter; and a start count value of the second counter used in determining the count time is changed based on a change of state of the threshold indication. In another yet further aspect of this embodiment, the timer circuit includes a second counter; and a number of counts by the second counter in determining the count time is changed based on a change of state of the threshold indication. In another further aspect of this embodiment, the timer circuit includes a second oscillator and second counter, a count rate of the second counter is controlled by the second oscillator; and an oscillator frequency of the second oscillator is changed based on a change of state of the threshold indication. In another further aspect of this embodiment, the timer circuit includes a second counter; and an end count value of the second counter used in determining the count time is changed based on a change of state of the threshold indication. In another further aspect of this embodiment, the timer circuit includes a second counter; and the count time is decreased in response to the threshold indication changing from a state indicating a lower temperature to a state indicating a higher temperature. In another aspect of this embodiment, the count to temperature relationship of the output of the temperature sensor is changed based on a change of state of the threshold indication. In a further aspect, a start count value of the first counter is changed based on a change of state of the threshold indication. In another aspect of this embodiment, an oscillator frequency of the first oscillator is changed based on a change of state of the threshold indication. In another aspect of this embodiment, the oscillator frequency of the first oscillator is decreased in response to the threshold indication changing from a state indicating a lower temperature to a state indicating a higher temperature.

In another embodiment of the present invention, a method of determining a temperature condition with respect to a threshold temperature includes a) providing a signal to a comparator circuit indicating an end of a period of a first time duration; b) running a counter during the period and providing a counter output of the counter to the comparator circuit, wherein the counter output has a first count to temperature relationship; c) comparing at the end of the period by the comparator circuit, the counter output with a reference value to determine a state of a threshold indication, the reference value is indicative of a threshold temperature, the threshold indication is an indication of temperature with respect to the threshold temperature; d) in response to the threshold indication changing state as a result of the comparing step from a first state to a second state, changing one of: the first time duration to a second time duration; or the first count to temperature relationship to a second count to temperature relationship; and after the changing step, performing step a, step b, and step c again with either the second time duration for the first time duration or the second count to temperature relationship for the first count to temperature relationship. In one aspect of this embodiment, the changing step includes, in response to the threshold indication changing state as a result of the comparing step from a first state to a second state, changing the first time duration to the second time duration; and the performing step includes, after the changing step, performing step a, step b, and step c again with the second time duration for the first time duration. In another aspect of this embodiment, the signal is provided by a timer circuit that includes a second counter used for determining the end of the period, wherein changing the first time duration to a second time duration includes changing a starting count value of the second counter used in determining the end of the period from a first start value to a second start value. In another aspect of this embodiment, the signal is provided by a timer circuit that includes a second counter used for determining the end of the period, wherein changing the first time duration to a second time duration includes changing a starting count value of the second counter used in determining the end of the period from a first end value to a second end value. In another aspect of this embodiment, the signal is provided by a timer circuit that includes a second counter used for determining the end of the period, wherein changing the first time duration to a second time duration includes changing a number of counts by the second counter in determining the end of the period from a first number of counts to a second number of counts. In another aspect of this embodiment, the signal is provided by a timer circuit that includes a second counter used for determining the end of the period, a count rate of the second counter is controlled by an oscillator, wherein changing the first time duration to a second time duration includes changing a frequency of the oscillator from a first frequency to a second frequency. In another aspect of this embodiment, the changing step includes, in response to the threshold indication changing state as a result of the comparing step from a first state to a second state, changing the first count to temperature relationship to the second count to temperature relationship; and the performing step includes, after the changing step, performing step a, step b, and step c again with the second count to temperature relationship for the first count to temperature relationship. In a further aspect of this another aspect, the changing the first count to temperature relationship to a second count to temperature relationship includes changing a starting count of the counter at a beginning of the period from a first start value to a second start value. In another further aspect of this another aspect, a count rate of the counter is controlled by an oscillator; and the changing the first count to temperature relationship to a second count to temperature relationship includes changing a frequency of the oscillator from a first frequency to a second frequency.

What is claimed is:

1. A temperature threshold circuit comprising:
   a temperature sensor including a first oscillator and first counter, a count rate of the first counter is controlled by the first oscillator, the temperature sensor including an output for providing a count indicative of a temperature;
   a timer circuit including an output;
   a storage device for storing an indication of a threshold temperature;
   a threshold indication circuit including a comparator for comparing the output of the first counter with the indication of the threshold temperature at a time indicated by the output of the timer circuit to provide a threshold indication of temperature with respect to the threshold temperature based on the comparing, wherein one of a count time of the timer circuit or a count to temperature relationship of the output of the temperature sensor is changed based on a change of state of the threshold indication.

2. The circuit of claim 1 wherein the count time of the timer circuit is changed based on a change of state of the threshold indication.

3. The circuit of claim 2 wherein:
the timer circuit includes a second counter;
a start count value of the second counter used in determining the count time is changed based on a change of state of the threshold indication.

4. The circuit of claim 2 wherein:
the timer circuit includes a second counter;
a number of counts by the second counter used in determining the count time is changed based on a change of state of the threshold indication.

5. The circuit of claim 2 wherein:
the timer circuit includes a second oscillator and second counter, a count rate of the second counter is controlled by the second oscillator;
an oscillator frequency of the second oscillator is changed based on a change of state of the threshold indication.

6. The circuit of claim 2 wherein:
the timer circuit includes a second counter;
an end count value of the second counter used in determining the count time is changed based on a change of state of the threshold indication.

7. The circuit of claim 2, wherein:
the timer circuit includes a second counter;
the count time is decreased in response to the threshold indication changing from a state indicating a lower temperature to a state indicating a higher temperature.

8. The circuit of claim 1 wherein the count to temperature relationship of the output of the temperature sensor is changed based on a change of state of the threshold indication.

9. The circuit of claim 8 wherein a start count value of the first counter is changed based on a change of state of the threshold indication.

10. The circuit of claim 1 wherein an oscillator frequency of the first oscillator is changed based on a change of state of the threshold indication.

11. The circuit of claim 1, wherein the oscillator frequency of the first oscillator is decreased in response to the threshold indication changing from a state indicating a lower temperature to a state indicating a higher temperature.

12. A method of determining a temperature condition with respect to a threshold temperature, the method comprising:
a) providing a signal to a comparator circuit indicating an end of a period of a first time duration;
b) running a counter during the period and providing a counter output of the counter to the comparator circuit, wherein the counter output has a first count to temperature relationship;
c) comparing at the end of the period by the comparator circuit, the counter output with a reference value to determine a state of a threshold indication, the reference value is indicative of a threshold temperature, the threshold indication is an indication of temperature with respect to the threshold temperature;
d) in response to the threshold indication changing state as a result of the comparing step from a first state to a second state, changing one of:
the first time duration to a second time duration; or
the first count to temperature relationship to a second count to temperature relationship;
after the changing step, performing step a, step b, and step c again with either the second time duration for the first time duration or the second count to temperature relationship for the first count to temperature relationship.

13. The method of claim 12 wherein:
the changing step includes, in response to the threshold indication changing state as a result of the comparing step from a first state to a second state, changing the first time duration to the second time duration;
the performing step includes, after the changing step, performing step a, step b, and step c again with the second time duration for the first time duration.

14. The method of claim 13 wherein the signal is provided by a timer circuit that includes a second counter used for determining the end of the period, wherein changing the first time duration to a second time duration includes changing a starting count value of the second counter used in determining the end of the period from a first start value to a second start value.

15. The method of claim 13 wherein the signal is provided by a timer circuit that includes a second counter used for determining the end of the period, wherein changing the first time duration to a second time duration includes changing a starting count value of the second counter used in determining the end of the period from a first end value to a second end value.

16. The method of claim 13 wherein the signal is provided by a timer circuit that includes a second counter used for determining the end of the period, wherein changing the first time duration to a second time duration includes changing a number of counts by the second counter in determining the end of the period from a first number of counts to a second number of counts.

17. The method of claim 13 wherein the signal is provided by a timer circuit that includes a second counter used for determining the end of the period, a count rate of the second counter is controlled by an oscillator, wherein changing the first time duration to a second time duration includes changing a frequency of the oscillator from a first frequency to a second frequency.

18. The method of claim 13 wherein:
the changing step includes, in response to the threshold indication changing state as a result of the comparing step from a first state to a second state, changing the first count to temperature relationship to the second count to temperature relationship;
the performing step includes, after the changing step, performing step a, step b, and step c again with the second count to temperature relationship for the first count to temperature relationship.

19. The method of claim 18 wherein the changing the first count to temperature relationship to a second count to temperature relationship includes changing a starting count of the counter at a beginning of the period from a first start value to a second start value.

20. The method of claim 18 wherein:
a count rate of the counter is controlled by an oscillator;
the changing the first count to temperature relationship to a second count to temperature relationship includes changing a frequency of the oscillator from a first frequency to a second frequency.

* * * * *